United States Patent [19]
Weber et al.

[11] Patent Number: 4,878,352
[45] Date of Patent: Nov. 7, 1989

[54] CRYOSTAT AND ASSEMBLY METHOD THEREFOR

[75] Inventors: Markus Weber; Andreas Ryser, both of Dübendorf; René Jeker, Hombrechtikon, all of Switzerland

[73] Assignee: Spectrospin AG, Zurich, Switzerland

[21] Appl. No.: 221,929

[22] Filed: Jul. 20, 1988

[30] Foreign Application Priority Data

Jul. 24, 1987 [DE] Fed. Rep. of Germany ....... 3724562

[51] Int. Cl.$^4$ ............................................. F25B 19/00
[52] U.S. Cl. .................................................... 62/51.1
[58] Field of Search ................................ 62/45, 514 R

[56] References Cited

U.S. PATENT DOCUMENTS

| 4,502,296 | 3/1985 | Ogata et al. | 62/514 R |
| 4,510,771 | 4/1985 | Matsuda et al. | 62/514 R |
| 4,535,595 | 8/1985 | Keller et al. | 62/514 R |
| 4,601,175 | 7/1986 | Kneip, Jr. et al. | 62/514 R |
| 4,694,663 | 9/1987 | Miller | 62/514 r |
| 4,765,153 | 8/1988 | Wachi | 62/514 R |

FOREIGN PATENT DOCUMENTS 0188389  1/1986  European Pat. Off. .

OTHER PUBLICATIONS

Proc. 9th International Cryo. Engineering Conference (ITCEC9), Kobe, 1982, Peter Berglund and Matti Savelainen, pp. 673 to 676: "A Superconducting Magnet for Whole Body NMR-Imaging".
Cryogenics, Feb. 1984, K. Pieterman and H. Postma: "A 1.5 T Superconducting Magnet with Closed Cooling System for Spin-Imaging: an Outline", pp. 59 to 62.
J. Phys. E: Sci. Instrum., vol. 12, 1979, Printed in Great Britian, Hamadi Abachi et al.: "Continuously Variable Cryostat Giving Accurate Settings at any Temperature Between 77 and 300 K", pp. 706 to 711.
J. Phys. E., vol. 7, 1974, pp. 423 to 424, A. Katzir: "A Temperature-Controlled Cryostat for Optical, Electrical and Glow Curve Measurements Between 77 and 800 K".

Primary Examiner—Ronald C. Capossela
Attorney, Agent, or Firm—Walter A. Hackler

[57] ABSTRACT

The invention provides a cryostat whose components are detachably connected to each other. Each of the tanks (1, 7) is equipped with only one radial pipe (15 or 16) arranged at the end of the tank (1, 7). Each of the inner components (3, 7) is provided, at its end neighboring the pipe (15), with a detachable cover (5, 9), and provided with a recess (31, 71) into which the pipe (15) can be introduced from the end of the component. The jacket (11) is divided in a plane neighboring the pipes (15, 16). The shorter section (45) comprises a recess for the pipes (15, 16) passing through the jacket, and a connection for a tower (19) enclosing the pipes. This makes it possible to do without any welded connections between those sections of the concentrically arranged components which pass through each other. These welded connections, which heretobefore were necessary, led to structures whose individual components could not be separated from each other without destructive manipulations and which further provided the disadvantage that the heat developed by the welding operations had detrimental effects on the application of a super-insulation.

9 Claims, 4 Drawing Sheets

CRYOSTAT AND ASSEMBLY METHOD THEREFOR

The present invention relates to a cryostat, in particular for superconductive magnets, comprising horizontally arranged tubular components which are nested in each other and closed at their ends by covers, and at least one inner and one outer tank for receiving a refrigerant, a radiation shield arranged between the said tanks and a jacket enclosing the outer tank, the inner and the outer tanks being provided each on their upside with a first and/or a second pipe which project outwardly and through the adjoining outer components and which are enclosed outside the jacket by a tower fitted on the jacket, and comprising further tension members interconnecting the components.

Cryostats of the described type have been generally known. Their production is, however, very complex, in particular when they are intended for receiving a superconductive magnet so that they are passed by a central pipe, because in this case each outer component must fully enclose the next inner component while on the other hand the tanks containing the refrigerant must be provided with lines leading radially outwardly and passing through the outer components. The lines are required for filling in and evaporating the refrigerant and, in certain cases, for establishing electrically conductive connections to the coil of the superconductive magnet. This particular construction of a cryostat has made it necessary heretofore to build the cryostat up part by part from the inside to the outside and to weld it together piece by piece. There is no other possibility of constructing such a cryostat and in particular of passing the pipes from the inner refrigerant tank to the outside, through the outer components. It has to be considered in this connection that the pipes must be connected with the respective tank in a vacuum-tight manner, which is preferably achieved by welding, but that the pipes cannot be fitted at a later stage because then the connection points between the pipe and the inner tank are no longer accessible being covered up by the outer components. The welding operations necessary for joining the individual components are on the one hand very expensive and make it impossible on the other hand to apply a continuous superinsulation between the individual components. Another disadvantage of such an arrangement is seen in the fact that once such a cryostat has been completed, it is practically impossible to carry out any repairs.

Now, it is the object of the present invention to provide a cryostat which is constructed in such a manner that it can be assembled with a minimum of welding work and that the cryostat can be opened again after completion for the purpose of carrying out repair work.

This object is achieved according to the invention by an arrangement which is characterized in that the first pipe is arranged near one inner end of the inner tank, that the components arranged between the inner tank and the jacket are equipped with a detachable cover at the end where the first pipe is located and provided with a recess extending up to that end of the component and enabling the first pipe to be introduced from the end of the component when the cover is removed, that the second pipe is arranged beside the recess of the outer tank, that the jacket is subdivided into a longer and a shorter section along a plane neighboring the two pipes and located at the side of the pipe opposite the end of the jacket and the circumferential surface of the shorter section comprises an opening for the pipes passing through the jacket, and that the tower enclosing the two pipes is joined to the jacket along the edge of the opening.

The design of the cryostat according to the invention enables the different components of the cryostat to be substantially completed prior to their assembly—except for the arrangement of the detachable cover to be mounted on one end each—and to be inserted into the respective outer component or put over the respective inner component, if desired together with an insulating layer. During this operation the first pipe, which projects radially from the inner tank, can be introduced into the recesses provided for this purpose in the outer components these recesses being open towards the end of the components. As regards the covers, it will be sufficient to mount them by screwing since a sufficiently effective thermal contact can be achieved by this connection method and no vacuum-tight connection is required. Due to the fact that the second pipe is arranged beside the recess in the outer tank, the two pipes are positioned closely beside each other so that the can be accommodated in a common tower. By subdividing the jacket in such a manner that a short section is obtained whose circumferential surface is provided with a recess for the pipes passing through the jacket, it is rendered possible to slide this shorter section, with its recess in a correspondingly inclined position, over the closely neighboring pipes and to join it to the end of the longer section. The outside of the jacket offers ample space for the arrangement of flanges which then enable the two parts to be screwed together in vacuum-tight relationship. Finally, the connections in the area of the tower can then be realized by soldering or welding as the heat developed by these operations does not impair the structure of the cryostat and these connections can be easily separated in case it should become necessary at any time to open the cryostat. According to a further improvement of the invention, a contact pipe, which is in thermal contact with at least one of the pipes passing through this recess, is mounted on the recess of at least one of the components arranged between the inner tank and the jacket in order to utilize the cooling effect of the refrigerant evaporating through these pipes.

The ease of assembly of the cryostat can be further enhanced if, according to a further improvement of the invention, the neighboring components are interconnected by tension members which are fastened on the outside of the respective inner component by means of screws which are accessible from the outside through recesses provided in the wall of the respective outer component. The tension members can then be mounted on the insides of the respective components, already before their assembly, if it is ensured that the free end of the tension member comes to lie opposite an associated recess so that this end of the tension member will be accessible for being mounted on the inner component after the latter has been introduced into the outer component.

The tension members used for this mounting method consist, preferably, of fiber glass reinforced strip-like elements which exhibit enlarged end portions provided with bores for the fixing screws. Such tension elements, which form the subject-matter of another concurrent patent application provide the particular advantage that they require only little space between the components, that they are capable of bridging a certain lateral offset between the components and that, finally, they can be fixed by a single screw. Such a screw may, advantageously, comprise a head followed by a cylindrical portion resting against the associated component and serving as the pivot pin on which the tension member is seated with a certain play.

Finally, the end of the longer section of the jacket of a cryostat according to the invention may be provided with an arrangement for establishing a connection between the jacket and at least one inner tank which can be opened from the outside. Such an arrangement may, on the one hand, serve as temporary connection for transportation purposes and may be useful also during assembly of the tank according to the invention.

The invention is suited also for cryostats of the type comprising a central pipe which is joined to the end walls of the jacket and arranged concentrically to other pipes connected to the covers of the remaining components. In the case of cryomagnets, especially, such a central pipe encloses the useful area of the magnetic field generated by the superconductive coil. The ends of the pipes associated with the other components of such a cryostat may then simply engage central openings provided in the covers of the remaining components and be connected with such covers by means of split clamping rings comprising a conical surface engaging openings in the covers, and a cylindrical surface enclosing the pipe. These clamping rings may be arranged simply on the outside of the cover and fixed thereon by means of screws so that when the screws are tightened the conical surfaces are drawn into the openings of the covers and are, consequently, tightly applied against the circumference of the pipes to be fixed in place. This mounting method provides an extremely sturdy connection and ensures at the same time perfect centering of the pipes.

When mounting the pipe, which is exposed to room temperature and connected to the covers of the jacket it is important that this latter connection be vacuum-tight. At the same time, however, the connection means must not reduce the clear space inside the pipe. These difficult requirements can be met in a surprisingly simple manner by an arrangement which is characterized in that this pipe, too, engages by its ends corresponding openings of the end walls, that stop rings are provided on the pipe at a certain distance from the insides of the end walls and that sealing rings are arranged between the stop rings and the end walls so that the central pipe, when subjected to the air pressure acting on the jacket when the cryostat is evacuated, is retained and sealed solely by the end walls which are urged against the stop rings via the sealing rings. It will be understood that one makes use here of the forces—which may be very considerable in the case of larger cryostats—exerted by the air pressure on the end walls of the cryostat when the latter is in its evacuated state, for generating in this manner clamping forces by which the central pipe is securely fixed in place and, at the same time, perfectly sealed. Consequently, no expensive and bulky fixing elements are needed while at the same time any connection is avoided that would be difficult to open later.

The present invention further relates to a method for assembling a cryostat of the before-described design. This method is characterized by the steps of (a) positioning the inner tank on a gauge, with its lower end in open condition and its axis in vertical position;

(b) positioning the radiation shield on the gauge, over the inner tank, and assembling the tension elements interconnecting the inner tank and the radiation shield;

(c) mounting the contact pipe enclosing the first pipe on the radiation shield;

(d) positioning the outer tank on the gauge, over the radiation shield, and assembling the tension members interconnecting the radiation shield and the outer tank;

(e) positioning the larger section of the jacket on the gauge, over the outer tank, and assembling the tension members interconnecting the outer tank and the jacket;

(f) establishing the detachable connection between the jacket and the inner tank, and screwing the jacket to the gauge;

(g) transferring this pre-assembled arrangement into the horizontal position, and mounting it on a stand;

(h) establishing a thermal contact between the contact pipe fixed to the radiation shield and the first pipe;

(i) fastening the contact pipe on the outer tank and establishing a thermal contact between this contact pipe and the first pipe;

(k) mounting the cover of the radiation shield and additional tension members interconnecting the inner tank and the radiation shield;

(l) mounting the cover of the outer tank and additional tension members interconnecting the radiation shield and the outer tank;

(m) fitting the smaller section of the jacket, while introducing at the same time the two pipes, together with the contact pipe enclosing the first pipe and fastened on the outer tank, into the recess provided in the smaller jacket section, screwing the jacket sections together and mounting additional tension members interconnecting the outer tank and the jacket;

(n) mounting the tower on the outside of the jacket and establishing the vacuum-tight connection between the pipes of the two tanks and the tower; and (o) releasing the connection between the inner tank and the jacket.

It will be easily seen that it is possible with the aid of this method to join the completely finished and insulated components, if necessary provided also with tension members, without the necessity to carry out difficult welding operations which might impair an existing insulation. Only the thermal contacts between the contact pipe and the first pipe are made, preferably, by soldering and the vacuum-tight connection between the tower and the first and the second pipes are preferably made by welding. However, these soldered or welded points are easily accessible and limited to a very narrow space so that no detrimental effects result from the heat developed by these operations. The fact that the tower mounted on the outside of the jacket has to be cut open if it should ever become necessary to open the cryostat can be regarded as acceptable.

The invention will now be described and explained in greater detail by way of the embodiments shown in the drawing, it being understood that the features described in the specification and shown in the drawing may be used in other embodiments of the invention either individually or in any desired combination. In the drawing FIG. 1 shows a cryostat according to the invention, partly as a side view and partly as a cross-sectional view;

Figure 1:
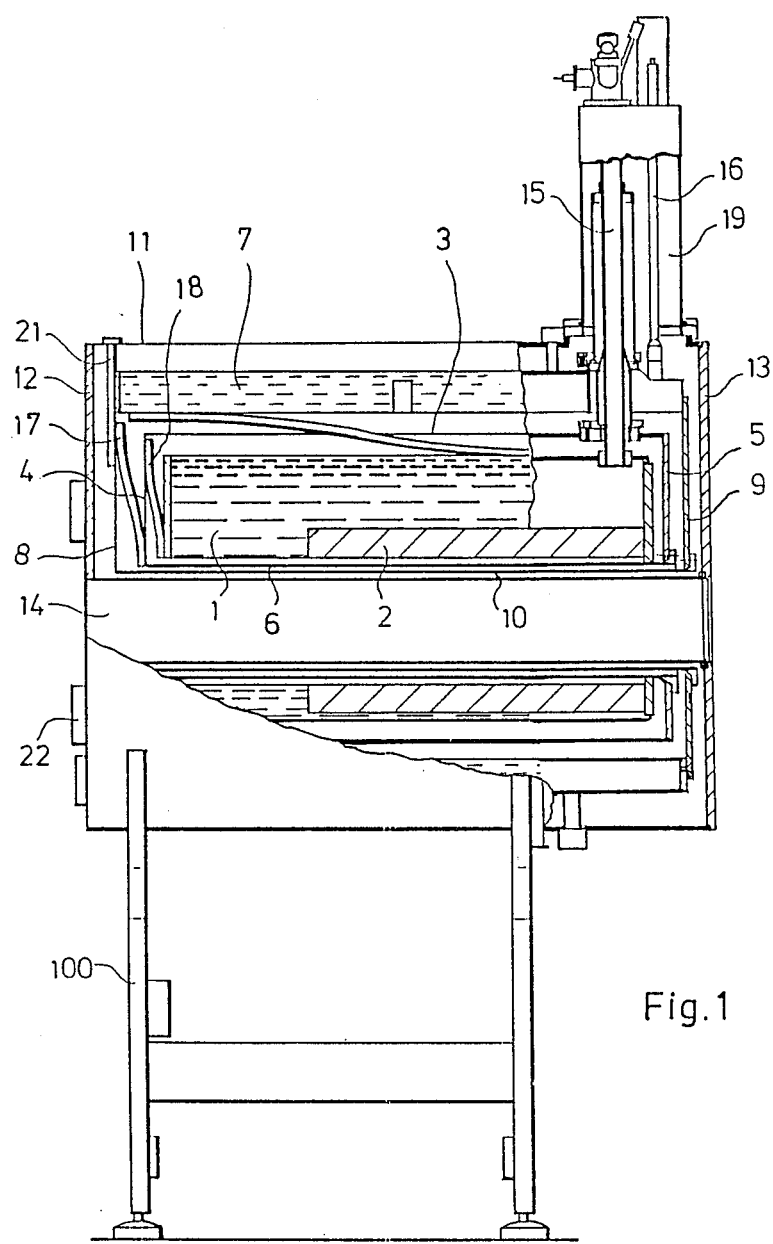
Figure 2:
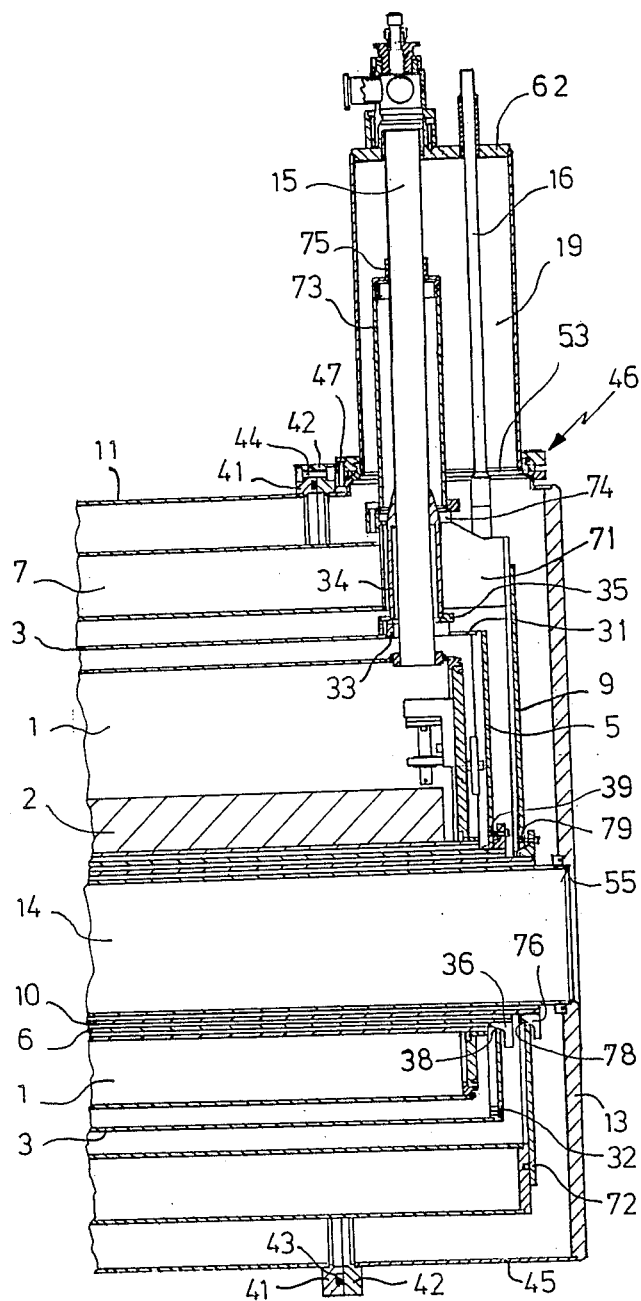
FIG. 2 shows the right portion of the cryostat shown in FIG. 1, in enlarged scale.
Figure 3:
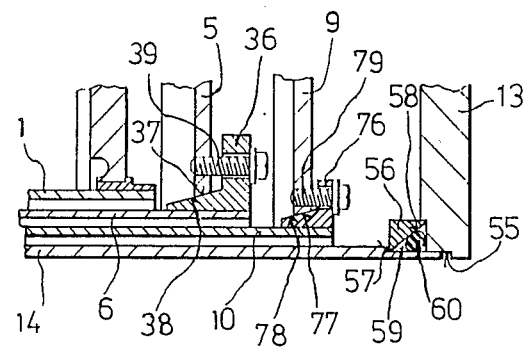
FIG. 3 shows a detail of FIG. 2, in further enlarged scale.

The cryostat illustrated in FIGS. 1 to 3 comprises a plurality of tubular components arranged concentrically to each other and with their axes extending in the horizontal direction. The arrangement shown consists of a helium tank 1 designed in the form of a double-walled pipe enclosing a superconductive coil 2. The helium tank 1 is surrounded, at a certain distance, by a radiation shield 3, the ends of which are closed by covers 4, 5 which are further interconnected by a central pipe 6 passing through the helium tank 1.

The next component, viewed from the inside to the outside, consists of a nitrogen tank 7, also designed in the form of a double-walled pipe. The ends of this tubular component are closed by covers 8, 9 which are again provided in their central areas with openings which are interconnected by a central pipe 10 which is in turn passed in concentrical relationship by the central pipe 6 of the radiation shield 3. Finally, the before-described components are enclosed by an outer jacket 11 whose end walls 12, 13 are again provided with openings which are interconnected by an inner central pipe 14 defining the space for the useful area of the magnetic field generated by the superconductive coil 2. The inner helium tank 1 is equipped with a first pipe 15 which projects radially outwardly therefrom—and vertically upwardly when the axes of the components extend in the horizontal sense. The first pipe 15 serves the functions of filling the helium tank 1 with liquid helium, permitting helium to evaporate and—in a manner not described in detail—establishing an electrically conductive connection to the superconductive coil 2. A second pipe 16 serving the functions of filling in nitrogen and permitting this refrigerant to evaporate, is connected to the nitrogen tank 7. The different components are interconnected by tension members 17, 18 arranged between the covers and/or end walls of the components, as indicated diagrammatically in FIG. 1.

The structure of the cryostat described to this point does not differ from the conventional design. The particularities of the described cryostat consist in the fact that the first pipe 15 which projects vertically upwardly from the helium tank 1 is arranged directly on one end of the helium tank, i.e. on the right end as viewed in the drawing. This feature provides the possibility to provide both the radiation shield 3 and the nitrogen tank 7 with recesses 31 and/or 71 which are open towards the end of the radiation shield and/or nitrogen tank and which enable the first pipe 15 to be introduced from the respective end. In order to render such introduction possible, the covers 5 and/or 9 arranged on those ends of the radiation shield 3 and the nitrogen tank 7 are detachably connected to the said radiation shield 3 and nitrogen tank 7, respectively, by means of screws 32 and 72. In addition, the second pipe 16 extending from the nitrogen tank is also arranged at the end of the nitrogen tank in the direct neighborhood of the first pipe connected to the helium tank 1, so that both pipes 15, 16 can be accommodated in a common tower 19. Further, the jacket 11 is subdivided into a longer and a shorter section along a plane located on the side of the tower 19 opposite the end wall 13. Each of the two sections is provided, in the area of this plane, with a flange 41, 42 which flanges accommodate between them a seal 43 and are screwed together by means of tightening screws 44. Further, the tower 19 is also fastened detachably on the shorter jacket section 45, again by means of a flange arrangement 46 and fixing screws 47.

The length of the shorter jacket section 45 corresponds substantially to the diameter of the flange arrangement 46 serving for fastening the tower 19.

Figure 5:
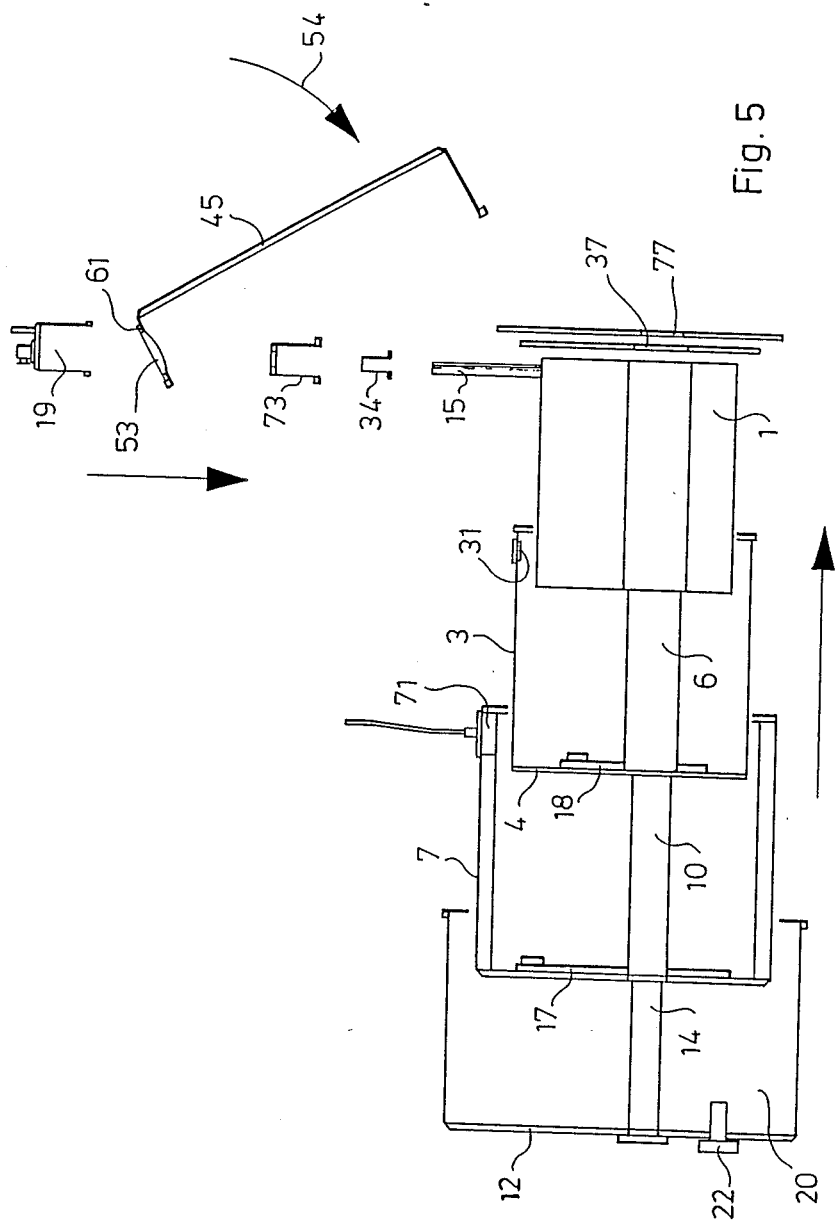
FIG. 5 is a diagrammatic representation illustrating the steps necessary for assembling the cryostat according to FIG. 1.

As illustrated diagrammatically in FIG. 5, for assembling the cryostat according to FIGS. 1 and 2, one initially brings the helium tank 1 into a position suitable for assembly, for example by positioning it on a gauge with the axis in vertical position and the first pipe 15, which projects radially from the helium pipe, located at the lower end of the tank. Then the radiation shield 3, provided on one end with a cover 4 and the central pipe 6 fastened thereon, are put over the helium tank so that the first pipe 15 is received in the recess 31 provided at the open end of the radiation shield 3. The edge of the recess 31 exhibits a reinforced portion 33 adapted for mounting a contact pipe 34. The contact pipe 34 is equipped with a connecting flange 35 resting against the reinforced portion 33. Once the radiation shield has been brought into the correct position, relative to the helium tank 1, the contact pipe 34 is mounted on the first pipe 15 connected to the helium tank 1, and screwed to the radiation shield 3 via the reinforced portion 33.

Thereafter, the nitrogen tank 7 with its central pipe 10 may be mounted in the same manner, with the recess 71 at the open end of the nitrogen tank receiving the first pipe 15 with the contact pipe 34 mounted thereon. Finally, the longer jacket section 20 with the central pipe 14 are mounted.

Figure 4:
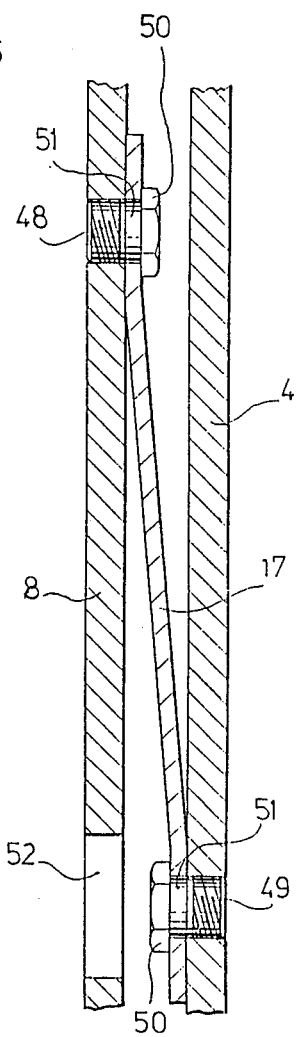
FIG. 4 shows another detail of the cryostat according to claim 1, but in further enlarged scale, illustrating the interconnection of the components of the cryostat according to FIG. 1 by means of the tension members.

Once the individual components have been mounted, one proceeds to connecting the cover of the outer component or the end wall 12 of the longer jacket section 20 to the cover of the next inner component, using one or more of the tension members 17, 18 represented diagrammatically in FIG. 1. The arrangement of such a tension member 17 between the cover 8 of the nitrogen tank and the cover 4 of the radiation shield is shown in greater detail in FIG. 4. The tension member 17 consists of a strip-like element which has been cut out from a fiber glass reinforced plastic sheet, e.g. from epoxy resin, and which comprises enlarged ends provided with bores for receiving the fixing screws 48, 49 which are not shown in detail in the drawing. Each of the two screws 48, 49 comprises a head 50 followed by a cylindrical portion 51 serving as a pivot pin for the tension member 17. The tension member 17 is mounted to pivot about the cylindrical portions 51 and can, in addition, be bent in such a manner that the tension member is capable of bridging the distance between the neighboring covers 4, 8. The tension members 17, 18 can be mounted on the inside of each cover before the respective component is mounted over the next inner component. In order to permit the other end of the tension member to be fastened on the outside of the neighboring cover, after such mounting operation, the outer cover is provided with a recess 52 at exactly the point where the free end of the tension member is located, so as to provide an assembly opening through which the corresponding screw 50 can be introduced into the bore at the free end of the tension member 17 and screwed into the threaded bore of the neighboring cover 4.

In the embodiment illustrated in FIG. 1, tension members of the described type are arranged between the radiation shield 3 and the helium tank 1, and between the covers of the nitrogen tank 7 and the radiation shield. The connection between the nitrogen tank 7 and the jacket 11 can be realized in principle in the same manner, although according to the representation of FIG. 1 other, conventional mounting elements 21 have been used for this purpose. In the embodiment shown, additional temporary fixing means 22 are arranged in the end wall 12 of the longer jacket section 20 by means of which the helium tank and the jacket can be rigidly connected in a manner not shown in detail. After mounting the longer jacket section 20, these temporary fixing means 22 should be conveniently engaged before proceeding with the assembly work.

While up to now the components have been positioned on a gauge with their axes in the vertical position, the time has now come to remove the pre-assembled parts from the gauge and to mount them on a frame 100, with their axes in the horizontal position. Once this has been done, the next step may consist in making the connection between the contact pipe 34 mounted on the radiation shield, and the first pipe 15, for example by soldering the end of the contact pipe 34 to the first pipe 15. The heat generated during this operation is limited to a very close space and does not affect any other components, or a super-insulation that may have been applied between the components during their assembly. Thereafter, another contact pipe 73 is fixed on a strip 74 arranged inside the nitrogen tank 7, at the edge of the recess 71. This contact pipe is also initially fitted on the first pipe 15, then fastened to the nitrogen tank 7, whereafter its free end 75 is soldered to the first pipe 15. Then, the covers 5 and 9 are screwed to the open ends of the radiation shield 3 and the nitrogen tank 7, respectively, and connected to the central pipes 6 and 10. The pipes 6 and 10 engage corresponding central openings 37 and 77 in the associated covers 5 and 9, respectively, and are fixed therein by means of clamping rings 36 and 76, respectively. Each of the clamping rings comprises a conical extension 38, 78 engaging the central opening 37, 77 in such a manner that the clamping rings, which are provided with a radial slot, are compressed and urged against the periphery of the associated pipe 6 or 10 when they are tightened on the covers by means of the tightening screws 39 or 79, being simultaneously centered in the opening 37 or 77 by means of the conical extension 38 or 78. This method provides a very solid connection between the covers and the central pipes, and ensures at the same time excellent thermal contact, while on the other hand it can be easily detached at any time. The same connection between the central pipes and the covers may be realized also on the other end of the components, although it would, basically, be possible also to make the connection on this end undetachable, for example by welding the pipes to the covers, because this connection can be made before the assembly operation and need not be released if it should ever become necessary to disassemble the cryostat.

Once the covers have been fastened on the ends of the components and the connections to the central pipes have been made, the covers of neighboring components may again be connected in the described manner by means of the described tension members. Thereafter, the short jacket section 45 is mounted. For this purpose, the jacket section 45 is slightly inclined—as indicated in FIG. 5—and the opening 53 provided in its circumferential surface is pushed over the pipe 15 with the outer contact pipe 73 and the neighboring second pipe 16 and then, at a certain angle, in the direction indicated by arrow 54 until its flange 42 comes to rest against the flange 41 of the longer jacket section 20 so that the two flanges can be connected by means of tightening screws 44. During this movement, the end of the central pipe 14 also comes to engage a corresponding opening 55 in the end wall 13 of the jacket section 45. The circumference of the pipe 14 is equipped, at a point neighboring the inside of the end wall, with a stop ring 56 bearing against a shoulder 57 facing the end of the pipe 14. This stop ring 56 exhibits the cross-sectional shape of a rectangular triangle with the hypotenuse 58 facing the end of the circumferential surface of the central pipe 14. This stop ring 56, therefore, defines together with the neighboring circumferential surface of the central pipe 14 and the adjacent inside of the end wall 13 a likewise triangular hollow space 59 accommodating a sealing ring 60. Here again, the connection between the central pipe 14 and the other end wall 12 of the jacket 11 may be realized in the same manner, although an undetachable connection between the end wall and the central pipe would also be possible on the other end of the jacket. For realizing the described connection to the right-hand end wall 13—as viewed in FIG. 1—no additional fixing means are required because after evacuation of the housing formed by the jacket 1 the end wall 13 is subjected to atmospheric pressure which tends to urge the end wall 13 inwardly thereby pressing the inner wall firmly against the stop ring 56 which in turn bears against the shoulder 57 in the circumference of the central pipe 14. Consequently, the before-mentioned parts are retained in a defined position, and the sealing ring 60 located in the hollow space 59 is simultaneously compressed so that a perfect seal is provided between these components.

After assembly of the short jacket section 45, one can finally proceed with the assembly of the tower 19 which is positioned on an annular flange 61 surrounding the opening 53, and fixed thereon by means of corresponding tightening and sealing elements. The tower 19 is closed at its upper end by a plate 62 to which the pipes 15 and 16 are connected in tight relationship, in particular by welding. Here again, no disturbing effects will result from the welding operation because the welding point is only very small so that the welding operation will not give rise to the development of considerable heat. Consequently, the welding connections can be made without any risk that other components may be damaged. In addition, such small welding points can be easily separated later so that they will not present any difficulty if it should become necessary at some later time to disassemble the cryostat.

Once the cryostat has been completed to this state, it may be transported to its definite location and, after removal of the temporary fixing means, rendered ready for operation by evacuating the space enclosed by the jacket, filling in the refrigerants and initiating the current flow in the superconductive coil.

It has become obvious from the above description that the embodiment shown is composed of individual components that have been pre-fabricated independently of each other and which are then connected in a manner which enable them to be disassembled again at some later time. Accordingly, two important objectives are achieved by the present invention, namely on the one hand a simplification of the production process and, on the other hand, the possibility to disassemble the cryostat without any problems for maintenance and/or repair purposes.

It is understood that the invention is not limited to the embodiment shown, but that deviations relating to the most different details of the structure are possible without leaving the scope of the present invention.

We claim:

1. A cryostat suitable for superconductive magnets, said cryostat comprising:
   a plurality of tubular components nested in each other said plurality of tubular components including at least one inner tank means and one outer tank means for receiving a refrigerant, a radiation shield disposed between said inner and outer tank means and jacket means for enclosing the outer tank means;
   a first pipe interconnected with said inner tank means proximate one inner end thereof and projecting outwardly and through adjoining outer tubular components;
   a second pipe interconnected with said outer tank means proximate one inner end thereof and projecting outwardly and through adjoining outer tubular components.,
   tension member means for interconnecting said plurality of tubular components;
   detachable cover means for sealing said radiation shield and said outer tank at ends thereof proximate the position of the first and second pipes;
   means defining a recess in both said radiation shield and said outer tank means for enabling the first pipe to be interconnected with said inner tank when the cover means are detached, said second pipe being disposed adjacent said first pipe and in communication with the recess in said outer tank; and
   tower means, joined to the jacket means, for enclosing the first and second pipes;
   said jacket means being subdivided into a longer and a shorter section along a plane neighboring the first and the second pipe and on a side thereof opposite a side of the first and second pipes proximate said cover means, said shorter section having means defining an opening in a circumferential surface of the shorter section for enabling the first and second pipes to pass therethrough, said opening being adapted for joining with said tower means.

2. The cryostat according to claim 1 further comprising contact pipe means, mounted on the recess of at least one of the radiation shield or outer tank means for providing thermal contact with at least one of the first or second pipes.

3. The cryostat according to claim 1 wherein the detachable cover means comprises at least one cover connected to an associated tubular component by means of screws.

4. The cryostat according to claim 1 wherein the tension member means interconnecting neighboring tubular components is fastened on the outside of a respective inner component by means of screws which are accessible from the outside through recesses provided in a wall of the respective outer component.

5. The cryostat according to claim 4 wherein said tension member means comprises strip-like elements including a reinforcing glass fiber weave and having enlarged end portions provided with bores for fixing screws.

6. The cryostat according to claim 4 wherein said fixing screws comprises strip-like followed by a cylindrical portion sized for resting against an associated component in order to serve as a pivot pin on which the said tension members are seated with a certain play.

7. The cryostat according to claim 1, wherein an end of the longer section of the jacket includes means for establishing a connection between the jacket and at least one inner tank means that can be opened from the outside.

8. The cryostat according to claim 1 further comprising a central pipe joined to end walls of the jacket and arranged concentrically with the tubular components and wherein the detachable cover means includes means for defining central openings which are engaged by the ends of the central pipe and that the central pipe is connected to the detachable cover means by split clamping rings.

9. The cryostat according to claim 1 wherein said jacket means comprises end walls with central openings which are interconnected by an inner central pipe passing through the space enclosed by the jacket, the inner central pipe engaging openings having a stop ring disposed at a certain distance from the insides of the jacket means end wall and a sealing ring is disposed between the stop ring and the said end wall so that when the said jack means is evacuated, the inner central pipe is retained in place and sealed solely by the jacket means end walls being pressed against the stop rings, via the sealing ring under the effect of the air pressure acting on the end walls of the said jacket means.

* * * * *